(12) United States Patent
Wortberg et al.

(10) Patent No.: US 10,153,632 B2
(45) Date of Patent: Dec. 11, 2018

(54) DEVICE AND METHOD FOR PROTECTING AN ELECTRICAL SYSTEM COMPONENT OF A VEHICLE ELECTRICAL SYSTEM

(71) Applicant: Lisa Draexlmaier GmbH, Vilsbiburg (DE)

(72) Inventors: Michael Wortberg, Dorfen (DE); Anton Bachmeier, Kumhausen (DE); Anton Ederer, Reisbach (DE)

(73) Assignee: Lisa Draexlmaier GmbH, Vilsbiburg (DE)

( * ) Notice: Subject to any disclaimer, the term of this patent is extended or adjusted under 35 U.S.C. 154(b) by 394 days.

(21) Appl. No.: 15/157,206

(22) Filed: May 17, 2016

(65) Prior Publication Data

US 2016/0344178 A1 Nov. 24, 2016

(30) Foreign Application Priority Data

May 18, 2015 (DE) .......................... 10 2015 107 718

(51) Int. Cl.
*H02H 3/00* (2006.01)
*H02H 3/087* (2006.01)
*G01R 31/00* (2006.01)

(52) U.S. Cl.
CPC ........... *H02H 3/087* (2013.01); *G01R 31/007* (2013.01)

(58) Field of Classification Search
CPC ..................................................... H02H 3/087
See application file for complete search history.

(56) References Cited

U.S. PATENT DOCUMENTS

| 5,895,989 A * | 4/1999 | Imaizumi ............. G01R 31/007 307/125 |
| 6,718,214 B1 * | 4/2004 | Schoettle .................. H02J 1/14 320/126 |
| 9,102,335 B2 * | 8/2015 | Mueller .............. B60W 50/029 |
| 9,789,764 B2 * | 10/2017 | Bissontz ............. B60L 11/1868 |
| 2001/0021091 A1 | 9/2001 | Weichler |
| 2016/0025019 A1 * | 1/2016 | Pearce ............... F02M 25/0836 123/520 |

FOREIGN PATENT DOCUMENTS

| DE | 199 64 097 A1 | 7/2001 |
| DE | 100 40 246 A1 | 3/2002 |
| DE | 10 2004 057 828 A1 | 6/2006 |
| DE | 10 2006 016 454 A1 | 10/2007 |
| DE | 10 2009 039 504 A1 | 2/2011 |
| DE | 10 2011 100 392 A1 | 11/2012 |

* cited by examiner

*Primary Examiner* — Stephen W Jackson
(74) *Attorney, Agent, or Firm* — Finnegan, Henderson, Farabow, Garrett & Dunner, LLP

(57) ABSTRACT

Embodiments relate to a device and method for protecting an electrical system component of a vehicle electrical system. The device comprises a semiconductor switch connected to the electrical system component. A circuit connected to the semiconductor switch comprises a detection unit for detecting an electrical malfunction of the vehicle electrical system and an activation unit for activating the semiconductor switch. A control unit communicatively connected to the circuit is configured to switch the semiconductor switch into a first safe state, in which the semiconductor switch is switched off, based on the detection of an electrical malfunction, and to selectively switch the semiconductor switch into the first safe state or into a second safe state, in which the semiconductor switch is switched on, based on at least one predetermined vehicle state.

20 Claims, 2 Drawing Sheets

DEVICE AND METHOD FOR PROTECTING AN ELECTRICAL SYSTEM COMPONENT OF A VEHICLE ELECTRICAL SYSTEM

CROSS REFERENCE TO RELATED APPLICATION

This application is based upon and claims the benefit of prior German Patent Application No. 10 2015 107 718.3, filed on May 18, 2015, the entire contents of which are incorporated herein by reference.

TECHNICAL FIELD

The present disclosure relates to a device for protecting at least one electrical system component of a vehicle electrical system, such as an on-board electrical system or an electrical energy system of a motor vehicle, hybrid vehicle or electric vehicle. The present disclosure further relates to a method for protecting at least one electrical system component of such a vehicle electrical system.

BACKGROUND OF THE DISCLOSURE

Vehicle electrical systems are used to supply a plurality of electrical consumers or loads with electric energy. Semiconductor switches, for example, can be used as high-side switches for switching these loads, which selectively supply the respective consumers with electric energy or shut the loads down.

Excess electric currents can occur in a vehicle electrical system as electrical malfunctions, which are caused by an overload or an electric short circuit, for example. With respect to the short circuits, for example, an undesirable electrical connection between a voltage-conducting electrical line and ground, or an undesirable electrical connection between two electrical lines conducting a voltage, may occur sporadically or permanently and to varying degrees. Protecting the vehicle electrical system against undesirable excess electric currents and/or short circuits is necessary for the functional reliability of a vehicle and to ensure protection against thermal overload.

When protection against thermal overload is a safety objective for functional reliability, the residual error probability that this safety objective is not achieved by the device should not be greater than a predefined metric (for example, 100 failures in time). Diagnostic coverage of at least 90%, for example, is part of the safety concept for this purpose. This means that 90% of latent faults, which could prevent the thermal overload from being detected and shut down, must be detected before damage occurs, for example as a result of a short circuit. If the diagnosis detects that the short circuit detection does not function, for example, then a latent fault is present. The fault is latent because a short circuit must occur in addition to the failure of short circuit detection for damage to occur. If the diagnosis detects a (latent) fault, the device must be brought into a predefined, safe state. The safe state OFF (load path is shut down) is an example of the safety objective involving the protection against thermal overload.

Typically, to satisfy vehicle safety requirements numerous vehicle functions need to switch into a type of "emergency off" as the safe state when an electrical malfunction exists. For example, an anti-lock braking system in which an electrical malfunction exists is shut down for driving safety, and the driver is notified. In the event of a fault, the forced shutdown of the respective vehicle function is thus a common safe state for vehicle functions.

In connection with more extensive vehicle functions, as implemented for autonomous driving and/or so-called drive-by-wire systems of a vehicle, for example, the availability-relevant supply of safety-critical functions is added as a new safety objective. Diagnostic coverage must also be implemented for this safety objective. The diagnosis detects whether the availability-relevant supply is jeopardized by latent faults in the system. If such latent faults are detected, the safe state must be assumed, for example ON, or at least ON until the vehicle can be shut down safely and the availability-relevant function can be shut down.

For a device that protects an electrical system component, the challenge is to satisfy the two safety objectives of protection against thermal overload and availability-relevant supply of safety-critical functions at the same time. If the diagnosis associated with the safety objective involving the protection against thermal overload detects a latent fault (for example, a fault in the short circuit detection), the system would have to be brought into the safe OFF state (even if no short circuit is present yet). The safe OFF state of the first safety objective, however, is also the unsafe state of the second safety objective involving the availability-relevant supply of safety-critical functions and thus results in violation of the second safety objective.

During autonomous driving, for example, it is understandable that a forced shutdown of a safety-relevant vehicle function for driving based on the detection of a latent fault as part of a diagnosis is not desirable. Rather, it is desirable in the case of such vehicle functions that an availability-relevant supply of the vehicle function, for example of an electrical consumer or an electrical load, with electric energy continues to take place reliably. In the case of such vehicle functions, a common safe state is thus to maintain the energy supply so as to prevent the shutdown.

This results in a conflict of objectives with respect to the two opposing safe states, namely between shutting down and maintaining the energy supply. A desire therefore exists to solve this conflict of objectives.

SUMMARY

Embodiments of the present disclosure disclose an option for protecting an electrical system component that improves the functional reliability of the electrical system component.

Embodiments of the present disclosure disclose a device for protecting at least one electrical system component of a vehicle electrical system comprising at least one semiconductor switch, which is connected to the at least one electrical system component in an electrically conductive manner. The device includes a circuit, which is connected to the semiconductor switch in an electrically conductive manner and which comprises a detection unit for detecting a malfunction, for example an electrical malfunction, of the vehicle electrical system and an activation unit for activating the semiconductor switch. The device further comprises a control unit, which is communicatively connected at least to the circuit. The device is configured to switch the semiconductor switch into a first safe state, in which the semiconductor switch is switched off, as a function of the detection of a malfunction, for example an electrical malfunction, and to selectively switch the semiconductor switch into the first safe state or into a second safe state, in which the semiconductor switch is switched on, as a function of at least one predetermined vehicle state, for example by way of the control unit.

In some embodiments, the device according to the present disclosure for protecting at least one electrical system component of a vehicle electrical system is configured to eliminate a conflict of objectives between previously mutually exclusive safe states. The device may eliminate a conflict between the first safe state which may be used to protect the electrical system component from an electrical malfunction, and the second safe state which may be used for an availability-relevant supply of the electrical system component with electric energy. The device according to the present disclosure exclusively functions electrically and/or electronically and requires no additional mechanical back-up system, so that it may be suited for drive-by-wire concepts and autonomous driving of a vehicle.

In some embodiments, the vehicle electrical system may comprise a plurality of different electrical and/or electronic components or modules and electrical lines as electrical system components. The device may be configured to protect one, two or more components of the vehicle electrical system, and may be configured to protect the components simultaneously. The electrical system component to be protected may be an electrical line of the vehicle electrical system, for example, which is to be protected against an electrical or thermal overload or excess electric current. The electrical line may be arranged in a wiring harness of the vehicle electrical system. The electrical system component may be any electrical or electronic consumer, any electrical load, an actuating element, a sensor, a control device or the like of a vehicle electrical system, if the electrical system component is to be protected against a malfunction. For example, the electrical system component can directly or indirectly assume a safety-relevant driving function for the vehicle equipped with the electrical system component, such as electric steering, braking, autonomous driving or the like, for example, so that an availability-relevant supply of the electrical system component with electric energy may be ensured.

According to embodiments of the present disclosure, the semiconductor switch can be a field-effect transistor (FET), for example, a metal-oxide-semiconductor field-effect transistor (MOSFET) or an n-type MOSFET. Compared to conventional switching elements such as relays and additionally required protection via fusible cutouts, the use of such semiconductor switches may provide comparatively fast switching processes while offering protection. In some embodiments, it is possible to more easily measure an electric current for intelligent energy management, free configure the protection of connected electrical lines via configurable safety characteristic curves, reduce a line cross-section as a result, and implement a substantially decentralized power distribution in inaccessible spaces of a vehicle, if necessary directly in the particular cable set.

According to embodiments of the present disclosure, the electrical malfunction can be, for example, an electrical and/or a thermal overload, or excess electric current. Such an electrical malfunction can occur, for example, by short circuits within the vehicle electrical system. The malfunction can be transient, (i.e. temporary and not permanent) or can occur sporadically.

A circuit may be understood to mean a unit or module of an electrical or electronic circuit, which fulfills the functions according to the present disclosure. A communicative connection between the control unit and the circuit can be understood to mean any kind of physical transmission of information between the control unit and the circuit, for example, a transmission of information via an electrical line, a data line, a data bus or the like. The circuit may include a bus system, for example a Serial Peripheral Interface (SPI).

According to embodiments of the present disclosure, the control unit can be designed and/or arranged separately from the circuit. Alternatively, the control unit may also be integrated in the circuit.

According to embodiments of the present disclosure, the vehicle state to be considered can be selected from a plurality of predetermined vehicle states. By way of example, this may be a wake-up phase of a vehicle, a switched positive or plus terminal of the ignition coil ("terminal 15 on") and/or an active driving cycle of the vehicle.

According to embodiments of the present disclosure, this configuration may enable the device to ensure that an electrical system component is protected against electrical overloads, for example transient electrical overloads. Additionally, however, an availability-relevant supply of the electrical system component with electric energy is not interrupted, at least not permanently, based on a single fault.

Previous devices and methods required connecting two semiconductor switches in series for a functionally reliable shutdown, for example when an electrical overload occurs, and connecting two semiconductor switches in parallel for the availability-relevant supply of an electrical system component. This required providing serial redundancy for the protection against an electrical malfunction and an additional parallel redundancy for the availability-relevant supply. This is not desirable for cost reasons and due to the installation space constraints in a vehicle and comparatively high power dissipation. The configuration according to the present disclosure may provide an option for protecting an electrical system component that has a more simple design and improves the functional reliability of the electrical system component.

According to an embodiment of the present disclosure, the first safe state or the second safe state may be prioritized by the control unit as a function of the at least one vehicle state. The safe state to be switched can be predefined at any time by a control entity superordinate to the circuit and can be modified as a function of a respective vehicle state and/or state of the vehicle electrical system. The safe state to be switched is thus not fixed and can be adapted to a respective vehicle state.

According to an embodiment of the present disclosure, to offer effective protection to the semiconductor switch against damage, the circuit comprises a malfunction shutdown unit, which forcibly switches the semiconductor switch at least temporarily into the first safe state as a function of the detection of an electrical malfunction. The duration for this forcible shutdown can be approximately 50 to 150 µs, and preferably approximately 100 µs, for example. For the purpose of shutting down the semiconductor switch as swiftly as possible, the malfunction shutdown unit can be arranged in such a way that the shutdown unit switches the semiconductor switch directly, for example without integrating the control unit in the process. In some embodiments, the forcible shutdown is always active depending on the severity of the electrical malfunction and/or depending on the vehicle function that must be fulfilled. In this way, the semiconductor switch can be shut down swiftly in the event of an electrical malfunction to avoid electrically or thermally induced damage to the semiconductor switch, and possibly the electrical system component connected the semiconductor switch in an electrically conductive manner.

According to an embodiment of the present disclosure, the device may be configured to selectively replace, superimpose or overload, or the like, an activation signal of the circuit, for example with an activation signal of the control unit, to forcibly switch the semiconductor switch into the second safe state. By selectively replacing the activation signal of the circuit, for example with an activation signal of the control unit, it may be possible to switch the semiconductor switch both into the first safe state as a function of the electrical malfunction and into the first safe state or the second safe state as a function of the at least one vehicle state. This means that, despite the semiconductor switch being prompted to switch into the first safe state by the circuit, for example by the activation unit and/or the malfunction shutdown unit, it can still be switched into the second safe state either instead or chronologically thereafter.

According to an embodiment of the present disclosure, an electrical malfunction can be detected reliably if the device, for example the detection unit, is configured to detect a voltage drop $U_{DS\text{-}On}$ at the semiconductor switch. The device can be configured to detect or measure a voltage drop at or across the drain-source resistance of the semiconductor switch, for example of a MOSFET, in the conducting state. For this purpose, the device, for example the detection unit, can comprise a measuring bridge circuit, the first branch of which is electrically connected to a drain terminal of the semiconductor switch and the second branch of which is electrically connected to a source terminal of the semiconductor switch. This detectable voltage drop is proportional to the electric current to be switched by the semiconductor switch, so that an indirect detection of the electric current for the determination of an electrical malfunction, for example excess electric current, is possible.

According to an embodiment of the present disclosure, to evaluate or determine whether an electrical malfunction is present, the detection unit comprises a differential amplifier and an evaluation unit for detecting an electrical malfunction. The differential amplifier may also be a comparator, which compares two voltages to each other. An analog-to-digital converter, which converts the analog voltage signal into a digital signal, may be used as the evaluation unit, for example. In this way, the voltage drop across the drain-source resistance of the semiconductor switch can be fed to the differential amplifier, and subsequently to the analog-to-digital converter. The digital signal can be evaluated, for example by the control unit. A software filter can be provided for evaluation, for example, which can be adapted to a wide variety of vehicle types and to their requirements in regard to the protection of the respective vehicle electrical system.

According to an embodiment of the present disclosure, to activate the semiconductor switch as quickly as possible, the circuit, for example the activation unit, comprises a gate driver. In addition, the circuit and the activation unit can comprise a charge pump for generating a certain gate voltage.

According to an embodiment of the present disclosure, to implement a smaller and comparatively cost-effective device, the circuit may be an integrated circuit, for example an application-specific integrated circuit (ASIC).

According to an embodiment of the present disclosure, the control unit may be a microcontroller configured to ascertain a plurality of vehicle states. The control unit can be communicatively connected to a vehicle bus, such as a LIN or CAN bus, for ascertaining a respective vehicle state. The microcontroller can be a battery management system, for example, such as a battery control device or another vehicle control device.

The present disclosure also relates to a method for protecting at least one electrical system component of a vehicle electrical system, comprising: providing or making available at least one semiconductor switch, which is connected to the at least one electrical system component in an electrically conductive manner; providing or making available a circuit, which is connected to the semiconductor switch in an electrically conductive manner and which comprises a detection unit for detecting an electrical malfunction of the vehicle electrical system and an activation unit for activating the semiconductor switch; providing or making available a control unit, which is communicatively connected at least to the circuit.

According to embodiments of the present disclosure, the semiconductor switch is switched into a first safe state, in which the semiconductor switch is switched off, as a function of the detection of an electrical malfunction, and is selectively switched into the first safe state or into a second safe state, in which the semiconductor switch is switched on, as a function of at least one predetermined vehicle state, for example by way of the control unit.

For the method according to the present disclosure, all the features of the above-described device for protecting at least one electrical system component of a vehicle electrical system can be used accordingly.

According to an embodiment of the present disclosure, the first safe state or the second safe state can be prioritized by the control unit as a function of the at least one vehicle state. Accordingly, the control unit can replace, superimpose or overload, or the like, an output signal of the circuit to forcibly switch a certain, optionally prioritized, safe state. For example, the safe state to be switched may be predefined at any time by a control entity superordinate to the circuit and can be modified as a function of a respective vehicle state and/or state of the vehicle electrical system.

According to an embodiment of the present disclosure, to optimally protect the semiconductor switch against damage, the semiconductor switch may be forcibly switched at least temporarily into the first safe state as a function of the detection of an electrical malfunction. The circuit may comprise a malfunction shutdown unit, which forcibly switches the semiconductor switch at least temporarily into the first safe state as a function of the detection of an electrical malfunction. For the purpose of shutting down the semiconductor switch as swiftly as possible, the malfunction shutdown unit can be arranged in such a way that the semiconductor switch can be switched directly, for example without integrating the control unit in the process.

According to an embodiment of the present disclosure, to achieve a high functional reliability of the vehicle electrical system, a forcible switch into the first safe state may take place at least temporarily whenever (i.e. in every case) an electrical malfunction occurs.

According to an embodiment of the present disclosure, an activation signal of the circuit can be selectively replaced, superimposed or the like by the control unit as a function of the at least one predetermined vehicle state, to forcibly switch the semiconductor switch at least temporarily into the second safe state. The semiconductor switch can thus still be switched into the second safe state at least temporarily even when an electrical malfunction is detected and/or present.

According to an embodiment of the present disclosure, a switch is made, at least once, from the forcibly switched first safe state into the second safe state as a function of the at least one vehicle state, and a switch into the first safe state is only made again when the same electrical malfunction is detected again.

The present disclosure can be used in a vehicle, for example a motor vehicle or a hybrid or electric vehicle.

The foregoing general description and the following detailed description are exemplary and explanatory only, and are not restrictive of embodiments consistent with the present disclosure. Further, the accompanying drawings illustrate embodiments of the present disclosure, and together with the description, serve to explain principles of the present disclosure.

BRIEF DESCRIPTION OF THE FIGURES

Exemplary embodiments of the present disclosure will be described hereafter with reference to the accompanying figures.

DETAILED DESCRIPTION

Figure 1:
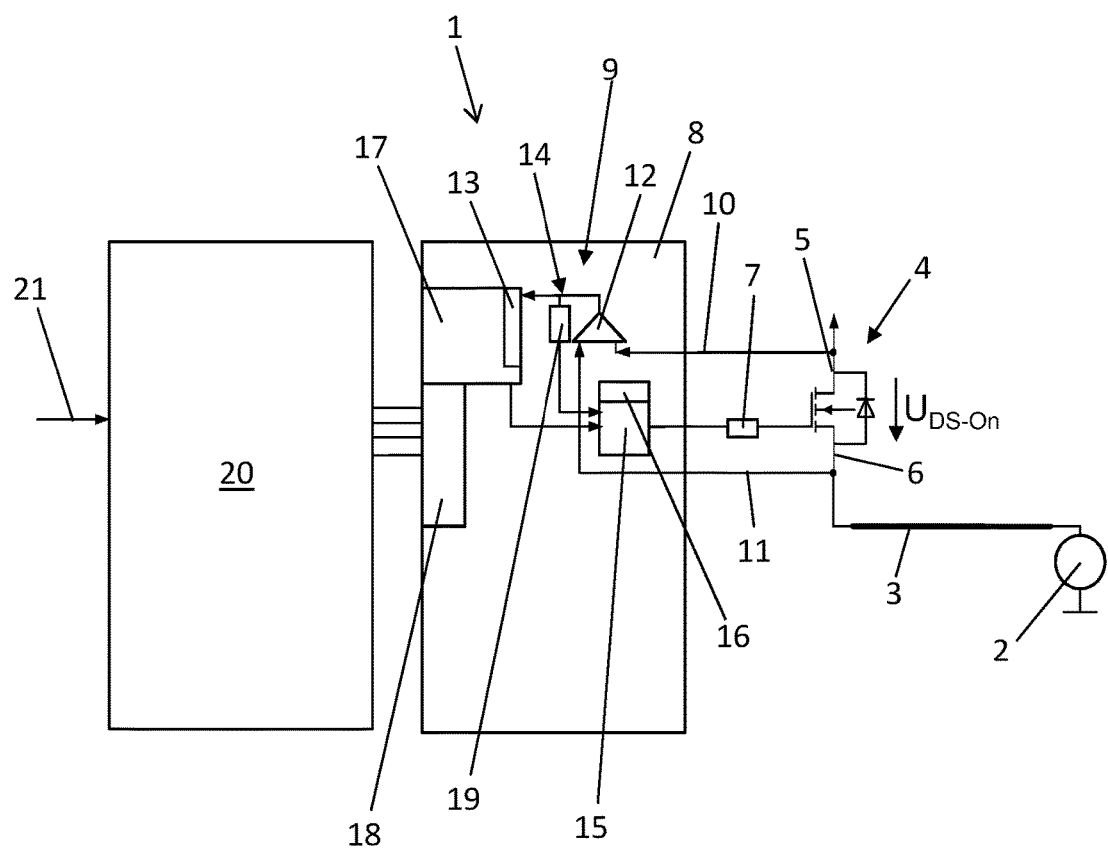
FIG. 1 shows a schematically illustrated block diagram of an exemplary device for protecting at least one electrical system component of a vehicle electrical system having a load channel to be switched.

The figures are only schematic representations and are provided only for explaining the present disclosure. Like elements are uniformly denoted by like reference numerals.

FIG. 1 shows a schematically illustrated block diagram of an exemplary device 1 according to the present disclosure for protecting at least one electrical system component of a vehicle electrical system (which is shown only in sections here). The vehicle electrical system is an on-board electrical system known as an electrical energy system of a motor vehicle.

The vehicle electrical system comprises an electrical line 3 connected to an electrical consumer or an electrical load 2. The electrical system component to be protected by the device 1 can be the electrical load 2 or the electrical line 3, or both elements, for example. This exemplary embodiment shows exactly one load channel by way of example.

FIG. 1 shows the device 1 comprises a semiconductor switch 4, which is connected via the electrical line 3 to the electrical load 2 in an electrically conductive manner. The semiconductor switch 4 is designed as a metal-oxide-semiconductor field-effect transistor (MOSFET), such as an n-type MOSFET. The semiconductor switch 4 includes a drain terminal 5, a source terminal 6, and a gate 7, or a gate terminal. When switched on, such a semiconductor switch 4 has a drain-source resistance $R_{DS-On}$ at which a detectable or measurable voltage drop $U_{DS-On}$ occurs, which is proportional to an electric current to be detected. Possible switch positions that the semiconductor switch 4 can assume are a first safe state, in which the semiconductor switch 4 is blocked or switched off, and a second safe state, in which the semiconductor switch 4 is switched on.

The device 1 further comprises a circuit 8, which via one or more electrical lines is connected to the semiconductor switch 4 in an electrically conductive manner or, alternatively thereto, forms an integral unit. In this exemplary embodiment, the circuit 8 is designed an integrated circuit (IC) such as an application-specific integrated circuit (ASIC).

The circuit 8 comprises a detection unit 9 for detecting an electrical malfunction of the vehicle electrical system, wherein the detection unit 9 in this exemplary embodiment comprises a system having a first branch 10 and a second branch 11 for detecting or measuring the voltage drop $U_{DS-On}$ of the semiconductor switch 4. The first branch 10 is connected to the drain terminal 5, and the second branch 11 is connected to the source terminal 6 of the semiconductor switch 4. The circuit 8 comprises a differential amplifier 12 that is supplied the detected voltage drop $U_{DS-On}$, and an analog-to-digital converter 13 supplied by the detected voltage drop $U_{DS-On}$ for converting the analog signal of the differential amplifier 12 into a digital signal.

The circuit 8 further comprises an activation unit 14 for activating the semiconductor switch 4, which in this exemplary embodiment comprises a gate driver 15 and a charge pump 16 supplying the gate driver 15.

The circuit 8 further includes an evaluation unit 17 having an evaluation logic for (pre-) evaluating the signal supplied by the detection unit 9. A serial interface 18 designed as a Serial Peripheral Interface (SPI) is provided for communicatively connecting the circuit 8 to other elements of the device 1.

FIG. 1 shows the circuit 8 comprising a malfunction shutdown unit 19, which functions as a rapid shutdown element for the semiconductor switch 4 (rapid shutdown for hard or transient short circuits). For this purpose, the malfunction shutdown unit 19 is connected within the circuit 8 directly to the gate driver 15 or the charge pump 16 in an electrically conductive manner. The function of the malfunction shutdown unit 19 is described in greater detail below.

The device 1 comprises a control unit 20, which is communicatively connected via the serial interface 18 to the circuit 8. As shown in FIG. 1, the control unit 20, which is a battery management system by way of example, is communicatively connected to a vehicle bus system 21 (indicated as an arrow) to obtain information about a respective vehicle state, among other things. A software filter, which proceeding from the voltage drop $U_{DS-On}$ across the semiconductor switch 4 processed by the detection unit 9 and/or the evaluation unit 17 of the circuit 8 determines an electrical malfunction, is implemented in the control unit 20. The electrical malfunction can be excess electric current, for example, such as an electric current that exceeds the maximum continuously permitted current due to short circuits or overloading.

Figure 2:
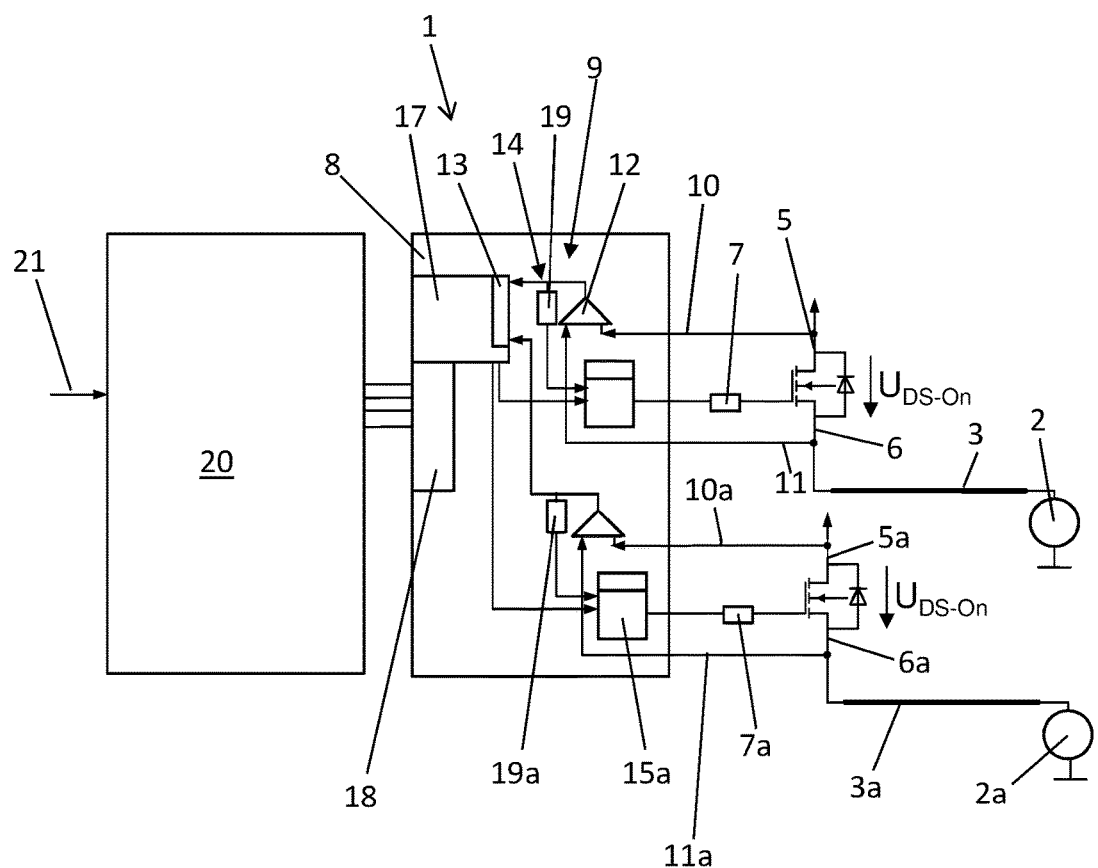
FIG. 2 shows the schematically illustrated block diagram of an exemplary device for protecting at least one electrical system component of the vehicle electrical system of FIG. 1, wherein the vehicle electrical system is expanded by a load channel to be switched.

FIG. 2 shows a schematically illustrated block diagram of the device 1 according to the present disclosure. As seen in FIG. 2, the device 1 is also able to protect more than one load channel, for example two, three, four or more load channels. The elements that are additionally required for this purpose correspond to those of the above device 1 in terms of design and function. For better illustration, the reference numerals of the elements that are used for the further load channel to be protected have been appended with the lower-case letter "a."

Based on FIG. 1, which shows the device 1 in a schematically illustrated block diagram, a possible operation of the device 1 or a method for protecting at least one electrical system component of a vehicle electrical system shall now be described in greater detail.

In general, the control unit 20 controls, via the serial interface 18, whether the load channel, of which there is only one in this exemplary embodiment, having the electrical load 2 is to be switched on or switched off. Via the charge pump 16, the circuit 8 generates the necessary gate voltage, which is connected via the gate driver 15 through to the gate 7 for activating the semiconductor switch 4.

To detect a possible electrical malfunction during operation of the vehicle or of the device 1, the circuit 8 detects or measures the voltage drop $U_{DS\text{-}On}$ across the semiconductor switch 4, which is proportional to the actual current to be detected. For this purpose, the detected voltage drop $U_{DS\text{-}On}$ is supplied to the differential amplifier 12. The amplifier, in turn, forwards the resultant signal to the analog-to-digital converter 13. Following the analog-to-digital conversion of the signal from the differential amplifier 12, this signal is forwarded or transmitted via the evaluation logic of the (pre-) evaluation unit 17 and the serial interface 18 to the control unit 20. The software filter, which proceeding from the (indirect) current measurement determines the load situation or overload situation as a possible electrical malfunction of the electrical line 3 and/or of the electrical load 2, is implemented in the control unit 20.

For hard short circuits, the malfunction shutdown unit 19 is implemented as rapid shutdown element. This unit is able to immediately shut down the semiconductor switch 4 directly, without the additional communication route via the control unit 20, in the case of hard, transient short circuits, to protect the semiconductor switch 4 and/or the electrical load 2 against damage.

Depending on the vehicle state, which is ascertained via the control unit 20 and/or the vehicle bus connected to the control unit 20, for example, the device 1 can now alternate between the first safe state and the second safe state, so that the safe state to be switched can be varied or prioritized as a function of the vehicle state.

By way of example, a prioritization of the first safe state and of the second safe state useful for a functionally reliable vehicle operation as described hereafter can be carried out.

A possible vehicle state is the so-called wake-up phase of the vehicle. It is provided here that the first safe state is prioritized and accordingly is predefined or predetermined, for the circuit 8 by the control unit 20 as a safe state to be assumed. During this wake-up phase of the vehicle, a diagnosis is carried out with respect to an electrical malfunction, and optionally a rapid shutdown by the malfunction shutdown unit 19. Moreover, a diagnosis of the activation of the semiconductor switch 4 is carried out.

During this wake-up phase, detected or diagnosed electrical malfunctions ensure that the semiconductor switch 4 remains switched off (i.e. remains in the first safe state) until the malfunction has been eliminated. As a result of feedback from the device 1, for example from the control unit 20, to other vehicle functions, the vehicle is also prevented from entering a driving cycle or a driving readiness state, so that the vehicle cannot be put into driving operation. In contrast, if no electrical malfunction is detected or diagnosed, the device 1, and the control unit 20, enables the vehicle to enter the driving cycle.

The prioritization is different in the exemplary vehicle state having a switched positive ("terminal 15 on") and where the driving cycle has already commenced. In this vehicle state, the second safe state has priority for the availability-relevant functions of the electrical system component and is accordingly predefined for the circuit 8 by the control unit 20.

Availability-relevant functions, such as drive-by-wire functions, should remain switched on in this vehicle state for driving safety reasons and must therefore continue to be supplied with electric energy in a functionally reliable manner. The detection or diagnosis of the electrical malfunction, however, is still active. If an electrical malfunction is detected, a switch is nonetheless made into the second safe state, or a second safe state that has already been switched is nonetheless maintained. The malfunction, however, is communicated to the control unit 20 and stored there. If an electrical malfunction is not present (at least temporarily), the semiconductor switch 4 remains in the second safe state as long as no transient electrical overload is detected, and the semiconductor switch 4 is swiftly shut down by the malfunction shutdown unit 19, if necessary. Based on a control function stored in the control unit 20, the control unit can decide at what point in time or at what event a switch is made into the first safe state.

To protect the semiconductor switch 4 against damage, the malfunction shutdown unit 19 is active in any case, since the semiconductor switch 4 could be damaged if the shutdown takes place too slowly. A hard short circuit or an internal fault, for example due to electromagnetic radiation, shall be mentioned by way of example as a possible electrical malfunction. If the prioritization is now on the second safe state, in which the semiconductor switch 4 is and should remain switched on, the semiconductor switch 4 is still briefly switched over into the first safe state. However, since the second safe state is prioritized, the control unit 20 initiates rapid switching back over into the first safe state. This can take place comparatively swiftly, for example in approximately 50 to 150 µs, and preferably in approximately 100 µs. The first safe state is only assumed permanently and optionally prioritized if the electrical malfunction occurs again, and the malfunction shutdown unit 19 automatically switches the semiconductor switch 4 into the first safe state.

In this way, the semiconductor switch 4 can be switched into the first safe state, in which the semiconductor switch 4 is switched off (including forcibly), as a function of the detection of an electrical malfunction by the malfunction shutdown unit 19.

An activation signal of the malfunction shutdown unit 19 can be replaced or superimposed by the control unit 20 as a function of at least one predetermined vehicle state, and thereby the semiconductor switch 4 can be selectively switched into the second safe state, in which the semiconductor switch 4 is switched on. In this way, it is ensured not only that the electrical system component and the semiconductor switch 4 are swiftly protected against a transient electrical overload, but also that an availability-relevant supply of the electrical system component with electric energy is not interrupted for a single fault.

Proceeding from the illustrated exemplary embodiments, the device 1 according to the present disclosure and the method according to the present disclosure can be modified in a variety of ways.

For example, more than two vehicle states may be predetermined and/or ascertained, which are prioritized to differing degrees. Moreover, the circuit 8 does not have to be designed as an ASIC. An electronic component can be provided for evaluating a possible electrical malfunction, for example a trigger circuit, a comparator or the like.

While the present disclosure is illustrated and described in detail according to the above embodiments, the present disclosure is not limited to these embodiments and additional embodiments may be implemented. Further, other embodiments and various modifications will be apparent to those skilled in the art from consideration of the specification and practice of one or more embodiments disclosed herein, without departing from the scope of the present disclosure.

LIST OF REFERENCE NUMERALS 1 device
2, 2a electrical consumer/electrical load 3, 3a electrical line
4, 4a semiconductor switch
5, 5a drain terminal
6, 6a source terminal
7, 7a gate/gate terminal
8 circuit
9, 9a detection unit
10, 10a first branch
11, 11a second branch
12, 12a differential amplifier
13 analog-to-digital converter
14, 14a activation unit
15, 15a gate driver
16, 16a charge pump
17 evaluation unit
18 serial interface
19, 19a malfunction shutdown unit
20 control unit
21 vehicle bus system

What is claimed is:

1. A device for protecting at least one electrical system component of a vehicle electrical system, comprising:
a semiconductor switch connected to the at least one electrical system component in an electrically conductive manner;
an activation circuit connected to the semiconductor switch in an electrically conductive manner, the activation circuit further including:
a detection unit for detecting an electrical malfunction of the vehicle electrical system; and
an activation unit for activating the semiconductor switch based on the detected malfunction; and
a control unit communicatively connected to the activation circuit and configured to: (1) switch the semiconductor switch into a first safe state in which the semiconductor switch is switched off based on the detection of an electrical malfunction, and (2) selectively switch the semiconductor switch into the first safe state or into a second safe state, in which the semiconductor switch is switched on, based on at least one predetermined vehicle state.

2. The device according to claim 1, wherein the first safe state or the second safe state is prioritized by the control unit based on the at least one predetermined vehicle state.

3. The device according to claim 1, wherein the activation circuit further includes:
a malfunction shutdown unit which forcibly switches the semiconductor switch at least temporarily into the first safe state based on the detection of an electrical malfunction.

4. The device according to claim 1, wherein the device is configured to selectively replace an activation signal of the activation circuit by the control unit to forcibly switch the semiconductor switch into the second safe state.

5. The device according to claim 1, wherein the detection unit is configured to detect a voltage drop at the semiconductor switch.

6. The device according to claim 1, wherein the detection unit includes a differential amplifier and an evaluation unit supplied by the differential amplifier for detecting an electrical malfunction.

7. The device according to claim 1, wherein the activation unit includes a gate driver.

8. The device according to claim 1, wherein the activation circuit is an integrated circuit.

9. The device according to claim 1, wherein the control unit is a microcontroller configured to determine a plurality of vehicle states.

10. A method for protecting at least one electrical system component of a vehicle electrical system, the method comprising:
determining at least one vehicle state of a vehicle;
detecting a voltage drop across a semiconductor switch electrically connected to at least one electrical system component;
determining whether an electrical malfunction of the vehicle electrical system exists based on the detected voltage drop;
sending an activation signal for switching the semiconductor switch into a first safe state based on the determination of an electrical malfunction, wherein the semiconductor switch is switched off in the first safe state; and
controlling the semiconductor switch to switch into the first safe state or into a second safe state based on the determined at least one vehicle state, wherein the semiconductor switch is switched on in the second safe state.

11. The method according to claim 10, wherein the first safe state or the second safe state is prioritized based on the at least one vehicle state.

12. The method according to claim 10, wherein the semiconductor switch is forcibly switched at least temporarily into the first safe state based on the determination of an electrical malfunction.

13. The method according to claim 10, wherein the activation signal is selectively replaced to forcibly switch the semiconductor switch at least temporarily into the second safe state based on the at least one vehicle state.

14. The method according to claim 12, wherein the method further comprises:
switching, at least once, from the forcibly switched first safe state into the second safe state based on the at least one vehicle state, and
switching back into the first safe state when the same electrical malfunction is determined a second time.

15. A device for protecting at least one electrical system component of a vehicle electrical system, comprising:
a semiconductor switch electrically connected to the at least one electrical system component;
a circuit electrically connected to the semiconductor switch, the circuit further including a detection unit for detecting an electrical malfunction of the vehicle electrical system; and
a control unit communicatively connected to the circuit for determining at least one vehicle state;
wherein the control unit is configured to:
switch the semiconductor switch into a first safe state in which the semiconductor switch is switched off based on the detection of an electrical malfunction, and
selectively switch the semiconductor switch into the first safe state or into a second safe state, in which the semiconductor switch is switched on, based on the at least one vehicle state.

16. The device according to claim 15, wherein the first safe state or the second safe state is prioritized by the control unit based on the at least one vehicle state.

17. The device according to claim 15, wherein the circuit further includes:

a malfunction shutdown unit which forcibly switches the semiconductor switch at least temporarily into the first safe state based on the detection of an electrical malfunction.

18. The device according to claim 15, wherein the circuit further includes:
an activation unit for sending an activation signal to the semiconductor switch; and
wherein the device is configured to selectively replace the activation signal by the control unit to forcibly switch the semiconductor switch into the second safe state.

19. The device according to claim 15, wherein the detection unit is configured to detect a voltage drop at the semiconductor switch.

20. The device according to claim 15, wherein the detection unit includes a differential amplifier and an evaluation unit supplied by the differential amplifier for detecting an electrical malfunction.

* * * * *